(12) United States Patent
Malischke

(10) Patent No.: US 7,152,549 B2
(45) Date of Patent: Dec. 26, 2006

(54) VAPOR DEPOSITION SYSTEM

(75) Inventor: Roland Malischke, Söhnstetten (DE)

(73) Assignee: Carl-Zeiss-Stiftung, Oberkochen (DE)

( * ) Notice: Subject to any disclaimer, the term of this patent is extended or adjusted under 35 U.S.C. 154(b) by 339 days.

(21) Appl. No.: 10/192,532

(22) Filed: Jul. 11, 2002

(65) Prior Publication Data

US 2003/0019430 A1    Jan. 30, 2003

(30) Foreign Application Priority Data

Jul. 11, 2001    (DE)   ............... 101 33 748

(51) Int. Cl.
    *C23C 16/00*    (2006.01)
    *B05D 3/06*    (2006.01)
    *H01J 37/305*    (2006.01)

(52) U.S. Cl. .............. 118/723 EB; 118/726; 427/566; 373/14

(58) Field of Classification Search ......... 118/723 EB, 118/723 VE; 427/585; 373/10–17
    See application file for complete search history.

(56) References Cited

U.S. PATENT DOCUMENTS

| | | | | |
|---|---|---|---|---|
| 4,230,739 A | * | 10/1980 | Aichert et al. ............... | 427/597 |
| 4,755,036 A | * | 7/1988 | Suzuki et al. .................. | 385/8 |
| 4,816,912 A | * | 3/1989 | Suzuki et al. ............... | 358/300 |
| 5,277,938 A | | 1/1994 | Wegmann et al. | |
| 6,086,963 A | * | 7/2000 | Goedicke et al. ........... | 427/585 |
| 6,214,408 B1 | * | 4/2001 | Bahr et al. ..................... | 427/8 |
| 6,436,466 B1 | * | 8/2002 | Bahr et al. ..................... | 427/8 |

FOREIGN PATENT DOCUMENTS

| | | |
|---|---|---|
| DE | 64107 | 10/1968 |
| DE | 43 34 889 | 10/1993 |
| DE | 43 36 680 | 10/1993 |
| WO | WO 9313240 A1 * | 7/1993 |

OTHER PUBLICATIONS

"Elecktronenstrahl-Technologie", by S. Schiller et al, Wissenschaftliche Verlagsgesellschaft MBH, Stuttgart (1977), pp. 146 to 149, 172 to 181. (translation into Engish of highlighted sections also enclosed).

* cited by examiner

*Primary Examiner*—Karla Moore
(74) *Attorney, Agent, or Firm*—Walter Ottesen

(57) ABSTRACT

An arrangement for controlling the deflection of an electron beam in a vapor deposition system includes a control unit to which are assigned deflection modules (23, 27) which can be driven in accordance with respective selected functions. By driving these deflection modules, the electron beam can be deflected in two coordinate directions. At least one of the selected functions has a time-changing term via which the periodicity of the deflection of the electron beam (14) changes with respect to this coordinate direction. The term can be pregiven manually or automatically. The invention also relates to a method for controlling the deflection of the electron beam in a vapor deposition system.

10 Claims, 3 Drawing Sheets

VAPOR DEPOSITION SYSTEM

FIELD OF THE INVENTION

The invention relates to an arrangement for deflecting an electron beam as well as a vapor deposition system having an arrangement of this kind and a method for operating the same.

BACKGROUND OF THE INVENTION

A beam deflecting arrangement of a vapor deposition system is sold by the Leybold Company under the product designation "MDC e-Vap-PSL Programmable Sweep Control". In this beam deflecting arrangement it is possible to fix the course of the electron beam in advance of starting the vaporization process. This course is to be traveled by the electron beam during the subsequent operation of the vapor deposition system. In this context, it is possible to develop a pattern deviating from the courses of the electron beam deflection which are stored in the control of the vapor deposition system as a basic configuration. This pattern is subsequently traveled by the electron beam continuously in a repetitive manner.

It is, however, disadvantageous that the burn-off of the material to be vaporized is not optimal because of the periodic deflection of the electron beam. This burn-off is especially the largest at the center so that the crucible having the vaporization material must be exchanged prematurely which has a negative effect on cost because the material which is used is, as a rule, expensive and is, for example, gold. In addition, an unsymmetrical pear-shaped vapor cloud can occur.

The BOC Coating Technology Company markets a beam deflection system called a "Temescal Bipolar Sweep". In this system, the deflection in both coordinate directions can be sinusoidally-shaped or triangularly-shaped (with an adjustable fixed amplitude and adjustable fixed offset). The two deflecting frequencies can be different or they can be the same. The beam deflection runs synchronously in both coordinate directions only when the frequencies are the same. There are eight preadjustable parameter sets (amplitude, frequency, offset, each for the X-direction and the Y-direction) between which a switchover can be made during the vapor deposition procedure.

With this apparatus too, the burn-off on the vaporization material can be only imprecisely controlled because the deflecting functions are fixed to the sine and cosine functions or to the triangular function. It is only possible to adjust offset, amplitude and frequency once for each coordinate direction.

SUMMARY OF THE INVENTION

It is an object of the invention to provide a vapor deposition system wherein the symmetry and the maintaining of the vapor cloud are improved. It is also an object of the invention to reduce the manufacturing costs of thin layers in that the burn-off on the specimen takes place uniformly. It is further an object of the invention to configure the electron beam deflection more conveniently.

The vapor deposition system of the invention, wherein thin layers are produced, includes: a device for generating an electron beam; a deflecting device for deflecting the electron beam; a control unit for generating respective selected functions for driving the deflecting device to deflect the electron beam at respective periodicities in two coordinate directions; and, the control unit operating to generate at least one of the selected functions to include a term causing the periodicity of the one function to change with respect to the coordinate directions with the term changing over time.

With the above features, the uniform burn-off of a vaporization material by means of an electron beam is ensured. As a consequence, an especially symmetrical vaporization cloud is formed which is maintained during the coating operation because of the uniform burn-off.

A vapor cloud, which is uniformly symmetrical during operation, functions, on the one hand, advantageously to provide a uniform layer thickness on the substrates to be coated and, on the other hand, the vaporization material disposed in a crucible can be virtually completely consumed from which a cost advantage results. This cost advantage becomes especially effective the higher the cost of the vaporization material.

An arrangement with which an especially uniform burn-off can be achieved is realized with an electron beam which can be deflected in two coordinate directions in accordance with selected functions by driving deflecting modules. With the measure of providing at least one of the selected functions with a term, which changes over time, it was possible to deflect the electron beam with a periodicity changing as a function of time. This operates especially advantageously with crucible forms having rounded portions.

It has been shown to be advantageous to be able to input, via an input unit, the term via which the periodicity can be adjustable in advance, especially also during the vaporization process. This periodicity is changeable as a function of time. In this way, especially the vaporization rate of the material and the form of the vapor cloud, which is formed, can be corrected. With such corrections, especially fluctuations of the material characteristics and the condition of the material can be compensated with little effort.

Above all, waste can be reduced with the possibility to be able to undertake corrections, especially also with respect to the selected functions, even during the deposition process.

It has been shown to be advantageous to be able to program the time-dependent change. In this way, it is possible to generate electron beam deflections matched especially to the material, shape of the crucible, et cetera. These electron beam deflections can also be stored.

In the method of beam deflection, it is advantageous to permit the electron beam deflections to run coordinated with respect to time in the X-direction and Y-direction (that is, phase-locked). This time-dependent coordination can, for example, be achieved via a trigger signal in that the electron beam deflection is controlled in dependence upon the trigger signal.

Additionally, a slight wobble can be provided. With such a wobble, an especially uniform burn-off can be achieved via the electrons impinging on the surface of the vapor deposition material.

According to the invention, the electron beam deflections in both coordinate directions run under a unitary time-dependent control. The deflecting functions are so selected that the beam passes over the specimen essentially at constant velocity. In the case of sinusoidally-shaped deflection functions, the frequency is continuously changed.

The simplest variation of the invention uses for the deflection in the X-direction and Y-direction functions of the kind:

$$A(V(t))*\sin(f*V(t)) \text{ and } (A(V(t))*\cos(f*V(t))$$

wherein A(V(t)) is a triangular function and V(t) is the product of a velocity function v(t) and time (V(t)=t*v(t)) so that the burn-off advances uniformly in velocity at the center of the crucible and at the edge. In a manner known per se, a wobble (that is, a small higher frequency oscillation) can be superposed on the movements so described so that non-uniformities because of the greater intensity in the beam center compared to the beam edge can be further compensated. Furthermore, the vapor cloud is influenced in that the deposit of the vaporization material on the substrate to be vaporized is made even more uniform.

Another variation of the invention uses sine and cosine at fixed frequency and a changeable amplitude A(t) in the X and Y-directions. For a high amplitude A(t), the beam intensity is increased so that the beam more rapidly removes the vaporization material at the crucible edge. With such a beam, the level in the crucible is reduced with each passover of the electron beam at each location by the same amount even though the beam at some locations (especially at the edge region of the crucible) passes more rapidly over the vaporization material.

In another variation of the invention, the focusing of the electron beam is changed in dependence upon the velocity components in the X-direction and Y-direction with the objective to remove the vaporization material uniformly.

One can combine all possibilities with each other:
(a) coordinated deflection of the beam in both coordinate directions; and,
(b) simultaneous change of the beam intensity and the focusing of the electron beam.

This can all be carried out program controlled so that the vaporization material is removed uniformly.

The arrangement for deflecting an electron beam includes a control unit whereby the deflection modules assigned to the electron beam can be driven in two coordinate directions according to selected functions. In this way, the electron beam can be deflected in two coordinate directions in dependence upon the instantaneous position.

It has been shown to be advantageous to adjust the electron beam deflection in dependence upon the material to be vaporized by the selection of the adjustable parameters, especially of the high frequency signal component and of the time-changeable term.

Also, in the manufacture of multi-layer systems, it is possible, with the change of the material (which is to be vaporized and on which the electron beam impinges), to adapt simultaneously the deflection and/or velocity with which the electron beam is guided over the material to be vaporized and to thereby consider the different vaporization energies of the materials.

It has been shown to be advantageous to detect the rate of vaporization. In this way, on the one hand, the time point can be more exactly determined at which the material to be vaporized is completely consumed and, on the other hand, the deflection of the beam can be adapted in correspondence to the desired vapor deposition rate when a deviation from the desired vapor deposition rate is detected.

Furthermore, it is possible to carry out the deflection of the electron beam, oscillation function or other periodic function (for example, a triangular function or rectangular function) in dependence upon the shape of the crucible.

It is furthermore advantageous to select a periodic function in the range of 4 to 150 Hz as a base function.

In addition, it has been shown to be advantageous to provide the electron deflection with a wobble in the frequency range of 50 to 500 Hz. It has been shown to be especially advantageous to have a ratio of 4 to 1 of high-frequency wobbling to low-frequency base frequency of the periodic deflection.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
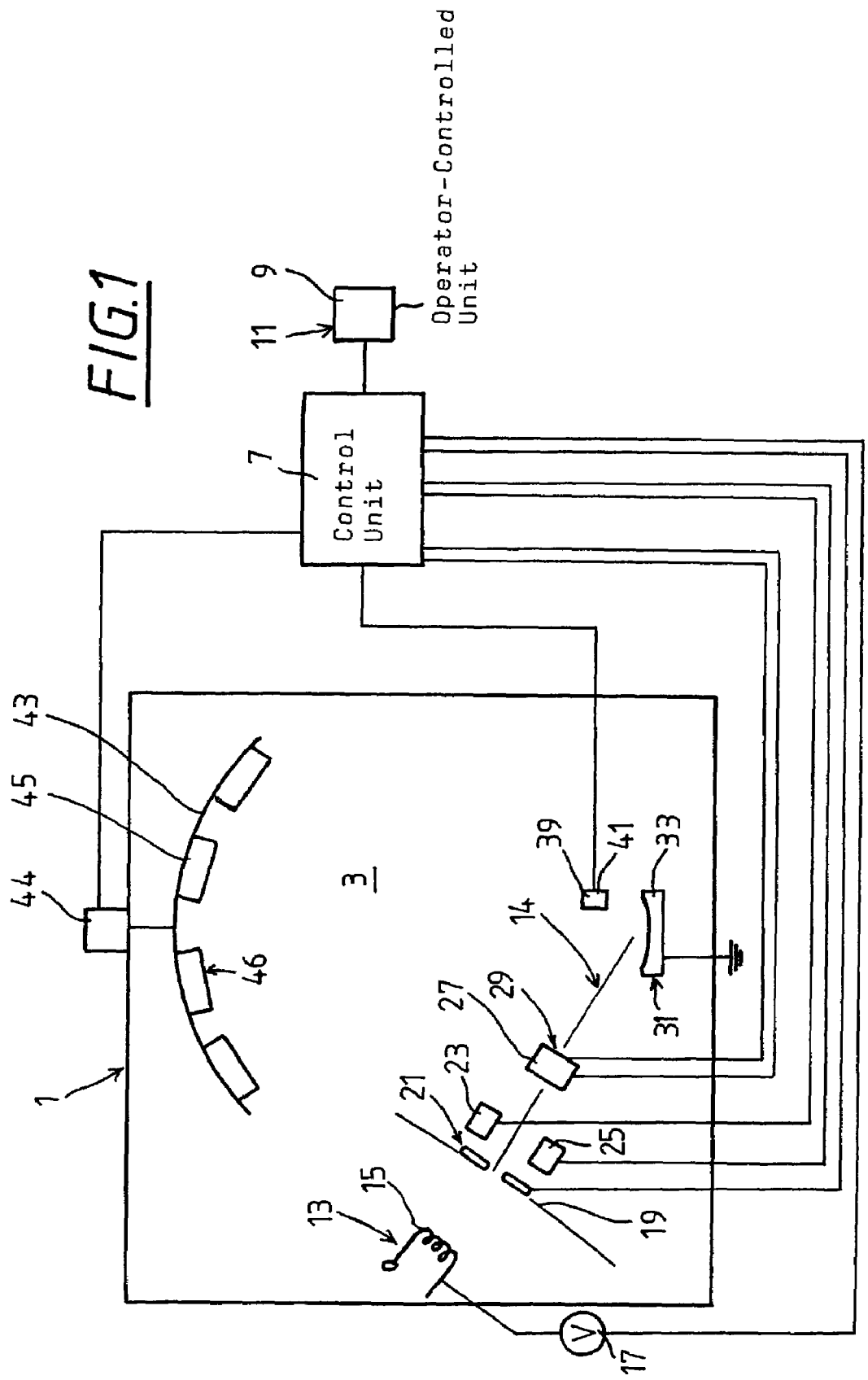
FIG. 1 is a schematic circuit diagram of a vapor deposition system.

The configuration of a vapor deposition system 1 is described with respect to FIG. 1. The vapor deposition system 1 of FIG. 1 includes a vacuum chamber 3 in which an electron source 13 is mounted for generating an electron beam 14. A filament 15 is provided as a source 13 of electrons. A voltage source 17 and a lattice 19 are assigned to the filament 15 so that the filament 15 emits electrons accelerated in the direction of lattice 19 because of the application of a voltage between the filament and the lattice. The lattice 19 is provided with an adjustable diaphragm 21 so that the electrons, which are accelerated in the direction of the lattice, can be focused by the diaphragm and the electron beam 14 is generated in this way.

A first deflection module 23, which includes electromagnets 25, is provided for deflecting the electron beam 14 in a first coordinate direction x. A second deflection module 27 is provided for the deflection in a second coordinate direction y and includes electromagnets 29. The deflection modules (23, 27) are driven for the targeted deflection of the electron beam by a control program. The control program will be described hereinafter with respect to an embodiment having a round crucible. This control program is stored in a CPU 101 which is a component of the control unit 7.

The adjustment of the adjustable diaphragm 21 as well as the voltage for accelerating the electrons emitted by the filament 15 are controlled by this control unit 7.

Figure 2:
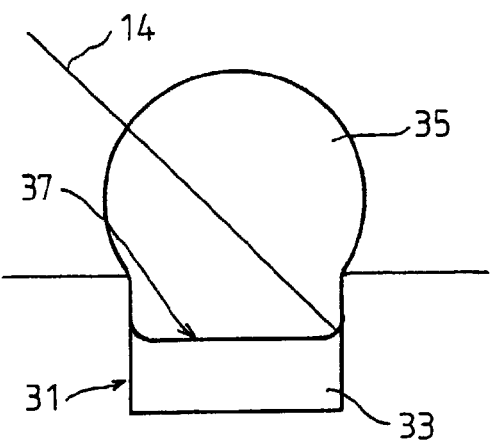
FIG. 2 is a schematic side elevation view of a crucible.

The electron beam 14 is directed onto a crucible 31 which is filled with a material 33 to be vaporized as shown in greater detail in FIG. 2. A detector 39 (for example, a quartz-crystal oscillator 41) for detecting the vaporized material or for detecting the rate of vaporization of the vaporization material 33 is assigned to this crucible 31.

A spherical cap 43 is mounted in the upper region of the vacuum chamber 3 and carries the substrates 45 which are to be coated. The substrates 45 can be lenses whose surfaces 46 are intended to be coated. The spherical cap 43 can be rotatably driven via an assigned motor 44. The motor is controlled by the control unit 7. An operator-controlled unit is assigned to the control unit 7 and is here configured in the form of a display 11. Via this display, adjustments can be undertaken which are carried out by means of the control unit 7. These adjustments can be made in advance of or even during the vaporization process.

FIG. 2 shows the crucible 31 in which the material 33 to be vaporized is held. The material 33, which is to be vaporized, is vaporized by means of the electron beam 14. A vapor cloud 35 is formed. The vaporization material is uniformly removed in dependence upon the guidance of the electron beam with reference to the surface of the vaporization material. This removal is identified by burn-off 37. The symmetrical configuration of a vaporization cloud 35 is ensured by the uniform burn-off of the vaporization material 33.

Figure 3:
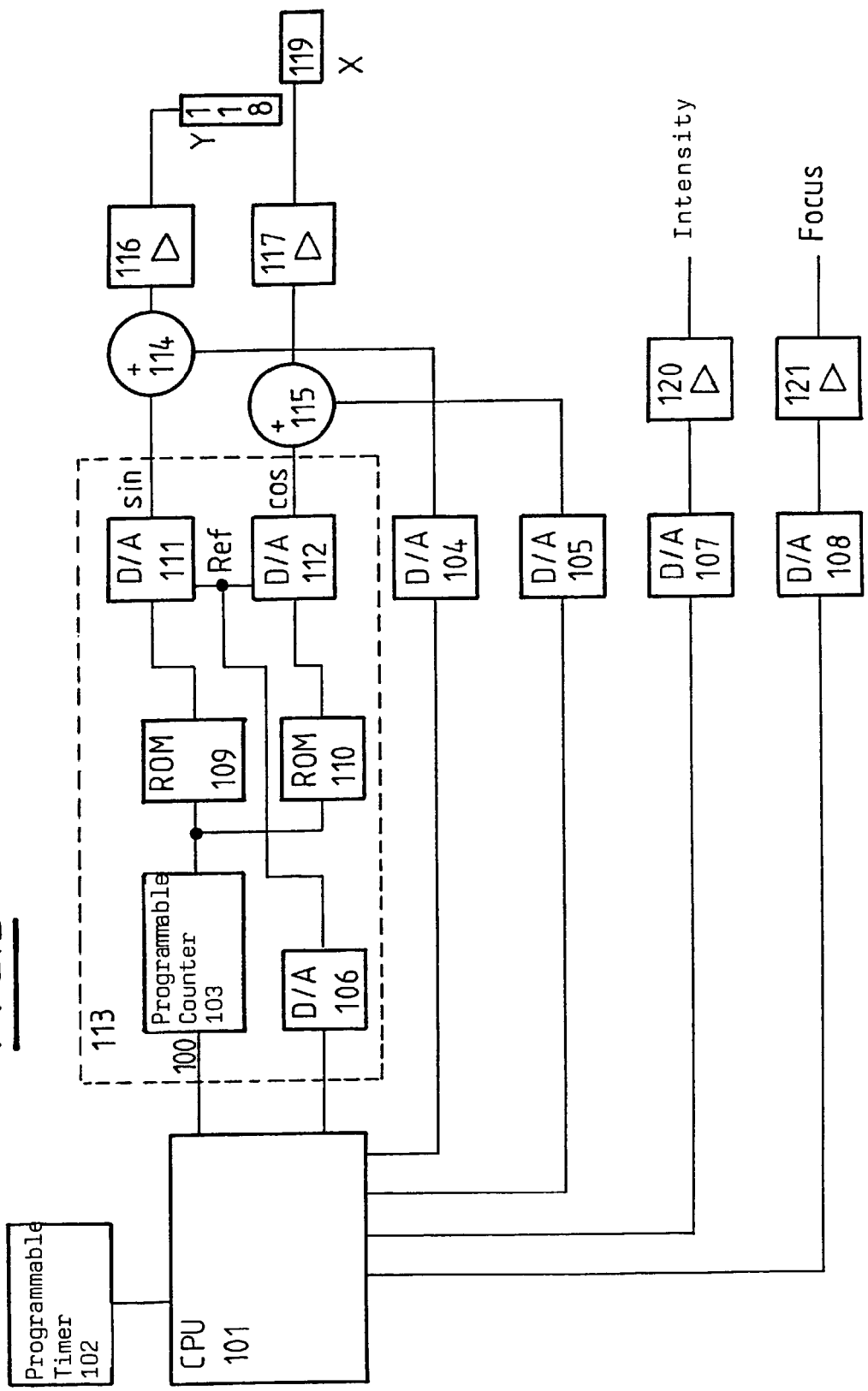
FIG. 3 is a block circuit diagram of the electron beam deflection.

FIG. 3 shows an advantageous embodiment of the control unit 7 for making available the beam deflection according to the invention. By means of this control unit 7, the voltage signals (118, 119) are generated which are applied to the deflecting modules (23, 27) for deflecting the electron beam. The control unit 7 includes a CPU-core 101 having a required read-only memory (ROM), a main memory and a control program. The CPU-core includes a ROM and a RAM. The CPU-core 101 has access to a programmable timer 102 which periodically transmits interrupts to the CPU-core 101 and furthermore makes available a higher-frequency periodic signal for a programmable counter 103. Furthermore, several digital-to-analog converters (104 to 108) are connected to the CPU-core 101. In short-term periodic intervals, the CPU-core 101 receives interrupts from the programmable timer 102 and loads new output values into the two digital-to-analog converters (104, 105) in dependence upon the received interrupts. In this way, a deflection of the electron beam 14 is coarsely controlled in the Y-direction and X-direction. The output values can be stored in a memory or can be generated by means of stored functions which can be stored in the CPU. As memories, a RAM and/or a ROM can be provided which is arranged in the CPU.

The programmable counter 103 includes a reducer which increases the count by 1 for each n-th pulse (for example, each 1000th pulse) on the clock input 100. The reduction factor (n) is pregiven in dependence upon time by the CPU-core. After reaching a highest value (for example, the number 4095), the counter is again reset to a start value, preferably to 0 with the next n-th clock pulse. The counter outputs are connected to the ROM components (109, 110) whose outputs are signal connected to corresponding ones of the downstream digital-to-analog converters (111, 112).

A sine signal and a cosine signal are outputted by the outputs of the digital-to-analog converters (111, 112). The frequency and phase positions of these outputted signals are matched to each other via the programmable counter 103 and are thereby coordinated to each other at each time point. This is also characterized as phase-locked.

The amplitude of the sine and cosine function is program-controlled adjusted by means of the digital-to-analog converter 106 and via the reference inputs connected to the digital-to-analog converters (111, 112). The entire function block 113 functions to superpose a wobble on the coarse deflection of the electron beam 14. The coarse deflection is induced by means of the two digital-to-analog converters (104, 105). The electron beam 14 is deflected by the deflection modules (23, 27) in accordance with a generated voltage signal. Of course, periodic functions other than the sine and cosine functions can be used for generating a wobbled voltage signal for deflecting the electron beam 14.

The two wobble signals go to the output stages (116, 117) via the summation amplifiers (114, 115). The output stages (116, 117) generate corresponding control currents (118, 119) from the two wobbled input voltages. The control currents (118, 119) are supplied to the deflection modules 27 for deflecting the electron beam in the X-direction and Y-direction.

Furthermore, the beam intensity is controlled by driving the voltage source 17 and the beam focusing is controlled by means of diaphragm 21 by the CPU-core 101 via the digital-to-analog converters (107, 108) having downstream output stages (120, 121).

Figure 4:
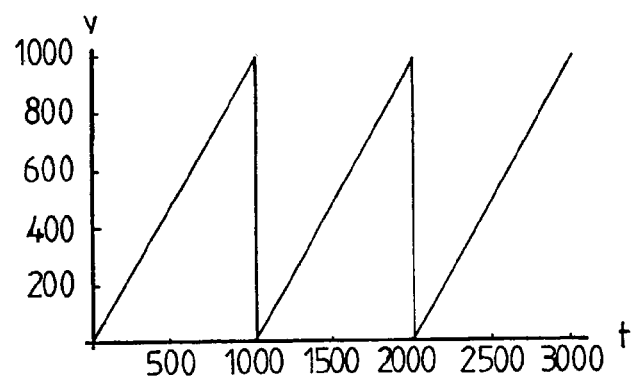
FIG. 4 illustrates the programmable counting.

In this embodiment, a control program is stored in the CPU-core which is periodically activated by the interrupt from the programmable timer 102. Here, the number of commands of a variable (v) is continuously counted in the control program up to a highest number (m) as shown in FIG. 4. With the next interrupt, the control program sets the count of the variable (v) back to zero and the count repeats again up to the highest number (m). The variable (v) is therefore proportional to time with repeating counting intervals. For the example shown in FIG. 4, m=1000.

The electron beam 14 is guided over the vaporization material 33 in accordance with an Archimedes spiral 47. The velocity is so controlled that the electron beam 14 passes over the same path lengths in the same time intervals. The Archimedes spiral 47 is mathematically described by:

$$x(\rho)=a*\rho*\cos(\rho+k), y(\rho)=a*\rho*\sin(\rho+k)$$

wherein 2*n*a (see FIG. 5) is the spacing of one spiral arm to the next and p is a fitting function of the time and k is a constant with which one can rotate the entire Archimedes spiral about its center point. So that the velocity of the electron beam 14 is constant, the CPU-core computes:

$$\rho(v) = \left(\sqrt{(2*c*v+c1)\left(\sqrt{(a)}\right)}\right)$$

wherein c and c1 are numerical constants so that the spiral within a reiteration of v does not extend beyond the extent of the crucible.

Figure 5:
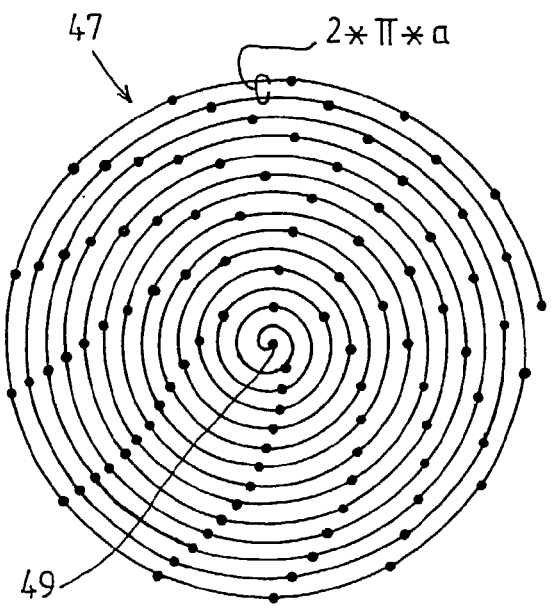
FIG. 5 is a graphic representation of the electron beam deflection for a round crucible.

In order to make the velocity relationships clear, the Archimedes spiral 47 is shown in FIG. 5 over which the electron beam 14 passes on the vaporization substrate 33 when the CPU-core, after the computation of $\rho(v)$, computes the output values $x(\rho)$ and $y(\rho)$ and stores the same in the analog-to-digital converters 104 and 105, respectively. In both cases, an additive offset value, which does not change with time, is considered. This offset value influences the center point position 49 of the Archimedes spiral 47. In order to make clear the velocity conditions, each 500th deflection value, for example, is shown by a thick point in FIG. 5. A correspondingly large repetition interval of v was selected. As shown in FIG. 5, the points along the curve are at equal spacings which correspond to a constant velocity referred to the traveled path of the deflected electron beam 14 and not the angle which was passed through. The angular velocity of the electron beam is deliberately variable in this embodiment.

FIG. 5 shows the trace of the beam when the wobble via the digital-to-analog converter 106 is switched off. When the wobble is active, a spiral movement having a low amplitude (for example, in the order of magnitude of the spiral arm distance (2*Π*a)) is superposed on the spiral.

So that the spiral cannot be run through each time in the same way, a small change on the constant (k) can be undertaken for each reiteration of v. In addition, one can reverse the sign of $x(\rho)$ or $y(\rho)$ alternately for each reiteration whereby the spiral is run through in the other direction.

This embodiment described here shows an especially advantageous control of the electron beam 14 for a round crucible 31. The invention is, however, not limited to a round crucible 31. In lieu of the Archimedes spiral 47, a beam guidance can be selected suitable for the form of the crucible used. Thus, for example, for an oval crucible, a coarse guidance of the electron beam along an elliptical path is suitable with changing radii. As shown by this additional variation, it can be recognized that many variation possibilities result which are included in the concept of the invention.

Furthermore, the CPU 101 is assigned a memory unit ROM wherein values are stored assigned to various vaporization materials. With these values, the velocity and the intensity with which the electron beam 14 passes over the vaporization material 33 are stored.

It is understood that the foregoing description is that of the preferred embodiments of the invention and that various changes and modifications may be made thereto without departing from the spirit and scope of the invention as defined in the appended claims.

What is claimed is:

1. A method for producing thin layers in a vapor deposition system including a device for generating an electron beam; and, a deflecting device for deflecting said electron beam in two coordinate directions; the method comprising the step of deflecting said electron beam in at least one of said coordinate directions with a periodicity changing as a function of time;
   wherein said electron beam is deflected in at least said one coordinate direction with an amplitude changing as a function of time; and,
   wherein the deflection of said electron beam in said coordinate directions takes place at respectively different velocities; and, a low-frequency base deflection and a highfrequency wobble are superposed on said deflection.

2. A method for producing thin layers in a vapor deposition system including a device for generating an electron beam; and, a deflecting device for deflecting said electron beam in two coordinate directions; the method comprising the step of deflecting said electron beam in at least one of said coordinate directions with a periodicity changing as a function of time; and,
   wherein the deflection of said electron beam in said coordinate directions takes place at respectively different velocities; and, a lowfrequency base deflection and a high-frequency wobble are superposed on said deflection.

3. The method of claim 2, wherein said electron beam is deflected in at least said one coordinate direction with an amplitude changing as a function of time.

4. The method of claim 2, wherein the time change of said periodicity and/or the amplitude is controlled in dependence upon the instantaneous position of said electron beam.

5. The method of claim 2, wherein said electron beam passes over the vaporization material to be burned off at a constant velocity with respect to the passed over distance.

6. The method of claim 2, wherein the intensity of said electron beam is varied.

7. A vapor deposition system wherein thin layers are produced from a burn-off of a material, the vapor deposition system comprising:
   a device for generating an electron beam;
   a deflecting device for deflecting said electron beam;
   a control unit for generating respective selected functions for driving said deflecting device to deflect said electron beam at respective periodicities in two coordinate directions;
   said control unit operating to generate at least one of said selected functions to include a term causing the periodicity of said one function to change with respect to said coordinate directions with said term changing over time; and,
   said at least one selected function being so selected that said electron beam passes over said material at constant.

8. A vapor deposition system wherein thin layers are produced, the vapor deposition system comprising:
   a device for generating an electron beam;
   a deflecting device f or deflecting said electron beam;
   a control unit for generating respective selected functions for driving said deflecting device to deflect said electron beam at respective periodicities in two coordinate directions;
   said control unit operating to generate at least one of said selected functions to include a term causing the periodicity of said one function to change with respect to said coordinate directions with said term changing over time; and,
   said at least one of said selected functions having a frequency which is continuously changed.

9. A method for producing thin layers in a vapor deposition system including a device for generating an electron beam; and, a deflecting device for deflecting said electron beam in two coordinate directions; the method comprising the steps of:
   deflecting said electron beam in at least one of said coordinate directions with a periodicity changing as a function of time; and,
   passing said electron beam over the vaporization material to be burned off at a constant velocity with respect to the passed over distance.

10. A method for producing thin layers in a vapor deposition system including a device for generating an electron beam; and, a deflecting device for deflecting said electron beam in two coordinate directions; the method comprising the step of deflecting said electron beam in at least one of said coordinate directions with a periodicity changing as a function of time and with a continuously changing frequency.

* * * * *

UNITED STATES PATENT AND TRADEMARK OFFICE
CERTIFICATE OF CORRECTION

PATENT NO. : 7,152,549 B2 Page 1 of 1
APPLICATION NO. : 10/192532
DATED : December 26, 2006
INVENTOR(S) : Roland Malischke It is certified that error appears in the above-identified patent and that said Letters Patent is hereby corrected as shown below:

Title Page: item [56]:
Under OTHER PUBLICATIONS:
line 3: delete: "Engish" and substitute -- English -- therefor.

Column 6:
Line 20: delete "x ($\rho$) = a*$\rho$*cos ($\rho$+k), y ($\rho$) =a*p*sin ($\rho$+k)" and substitute -- x ($\rho$) = a*$\rho$*cos ($\rho$+k), y ($\rho$) =a*$\rho$*sin ($\rho$+k) -- therefor.
Line 22: delete "2*n*a" and substitute -- 2*$\pi$*a -- therefor.
Line 23: delete "p" and substitute -- $\rho$ -- therefor.

Column 7:
Line 32: delete "highfrequency" and substitute -- high-frequency -- therefor.
Line 43: delete "lowfrequency" and substitute -- low-frequency -- therefor.

Column 8:
Line 18: insert -- velocity -- after "stant".
Line 22: delete "f or" and insert -- for -- therefor.

Signed and Sealed this

Third Day of July, 2007

JON W. DUDAS
*Director of the United States Patent and Trademark Office*